US006635907B1

(12) United States Patent
Nguyen et al.

(10) Patent No.: US 6,635,907 B1
(45) Date of Patent: Oct. 21, 2003

(54) TYPE II INTERBAND HETEROSTRUCTURE BACKWARD DIODES

(75) Inventors: Chanh N. Nguyen, Calabasas, CA (US); Joel N. Schulman, Malibu, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/441,903

(22) Filed: Nov. 17, 1999

(51) Int. Cl.$^7$ .............................................. H01L 29/772

(52) U.S. Cl. ...................................... 257/183; 257/185

(58) Field of Search ................................ 257/104, 183, 257/185, 189, 191

(56) References Cited

U.S. PATENT DOCUMENTS

| | | | | |
|---|---|---|---|---|
| 3,620,827 A | * | 11/1971 | Collet | 438/792 |
| 5,113,231 A | | 5/1992 | Soderstrom et al. | |
| 5,338,394 A | * | 8/1994 | Fathimulla et al. | 156/643 |
| 5,588,015 A | * | 12/1996 | Yang | 372/45 |
| 6,054,729 A | * | 4/2000 | Berenz | 257/192 |

FOREIGN PATENT DOCUMENTS

| | | |
|---|---|---|
| EP | 0899690 | 3/1999 |
| WO | WO 9961967 A | 12/1999 |

OTHER PUBLICATIONS

S.M. Sze, Physics of Semiconductor Devices, 1971, Wiley & Sons, p. 23.*

B.Su, V.J. Goldman, and J.E. Cunningham, "Single–electron tunneling in nanometer–scale double–barrier heterostructure devices," Physical Review B, vol. 46, No. 12, Sep. 15, 1992.

K. Nomoto, K. Taira, T. Suzuki, I. Hase, H. Hiroshima, and M. Komuro, "Diameter dependence of current–voltage characteristics of ultrasmall area AlSb–InAs resonant tunneling diodes with diameters down to nm," Appl. Phys. Lett. 70(15), Apr. 14, 1997.

T. Schmidt, M. Tewardt, R.J. Haug, K.V. Klitzing, B. Schonherr, P. Grambow, A. Forster, and H. Luth, "Peak–to–valley ratio of small resonant–tunneling diodes with various barrier–thickness asymmetries," Appl. Phys. Lett. 68(6), Feb. 5, 1996.

M. Reddy, M.J. Muller, M.J.W. Rodwell, S.C. Martin, R.E. Muller, R.P. Smith, D.H. Chow, and J.N. Schulman, "Fabrication and dc, microwave characteristics of submicron–Schottkycollector AlAs/In0.53GaGa0.47As/InP resonant tunneling diodes," J. Appl. Phys. 77(9), May 1, 1995.

L. Yang, J.F. Chen, and A.Y. Cho, "A new GaSb/AlSb/GaSb/AlSb/InAs double–barrier interband tunneling diode and its tunneling mechanism", J. Appl. Phys. 68(6), Sep. 15, 1990.

R.T. Syme, "Microwave Detection Using GaAs/AlAs Tunnel Structures",GEC Journal of Research, Vo. 11, No. 1, 1993.

(List continued on next page.)

*Primary Examiner*—Nathan J. Flynn
*Assistant Examiner*—Thomas L Dickey
(74) *Attorney, Agent, or Firm*—Tope-McKay & Associates

(57) ABSTRACT

A backward diode including a heterostructure consisting of a first layer of InAs and second layer of GaSb or InGaSb with an interface layer consisting of an aluminum antimonide compound is presented. It is also disclosed that the presence of AlSb in the interface enhances the highly desirable characteristic of nonlinear current-voltage (I-V) curve near zero bias. The backward diode is useful in radio frequency detection and mixing. The interface layer may be one or more layers in thickness, and may also have a continuously graded AlGaSb layer with a varying Al concentration in order to enhance the nonlinear I-V curve characteristic near zero bias.

17 Claims, 8 Drawing Sheets

OTHER PUBLICATIONS

H. Takaoka, C.-A. Chang, E.E. Mendez, L.L. Chang, and L. Esaki, "GaSb–AlSb–InAs Multi–Heterojunctions",Physics 117B & 118B (1983), 741–743, North–Holland Publishing Company.

H. Kitabayashi, T. Waho, and M. Yamamoto, "Crucial Role of Extremeley Thin AISB Barrier Layers In INAS/ALSB/INAS Resonant Interband Tunneling Diodes", Extended Abstracts of the International Conference on Solid State Devices and Materials, Japan Society of Applied Physics, Tokyo, Ja. 1997.

R. Beresford, L.F. Luo, K.F. Longenbach, and W.I. Wang, "Interband Tunneling in Single–Barrier INAS/AISB/GASB Heterostructures", Applied Physics Letters, US, American Institute of Physics, New York, vol. 56, No. 10, Mar. 5, 1990, pp. 952–954.

G. Ru and A. Li, "Proposal of Interband Tunneling Structures with Strained Layers", Journal of Applied Physics, US, American Institute of Physics, New York, vol. 76, No. 6, Sep. 15, 1994, pp. 3620–3622.

S. Tehrani, J. Shen, and H. Goronkin, "Three Terminal Quantum Structure Based on Resonant Interband Tunneling", Proceedings of the IEEE/Cornell Conference on Advanced Concepts in High Speed Semiconductor Devices and Circuits, US, New York, IEEE, Aug. 7, 1995, pp. 460–464.

J.N. Schulman, D.H. Chow, and T.C. Hasenberg, "INAS/Antimonide–Based Resonant Tunneling Structures with Ternary Alloy Layers", Solid State Electronics, GB, Elsevier Science Publishers, Barking, vol. 37, No. 4/06, Apr. 1, 1994, p. 981–985.

L.F. Luo, R. Beresford, and W.I. Wang, "Interband Tunneling in Polytype GaSb/AlSb/InAs Heterostructures", Applied Physics Letters, US, American Institute of Physics, New York, vol. 56, No. 10, Mar. 5, 1990, pp. 952–954.

A. Chang, L. Esaki, and E.E. Mendez, "InAs–AlSb–GaSb Tunnel Diode", IBM Technical Disclosure Bulletin, vol. 25, No. 3A Aug. 1982, pp. 1185–1186.

Ru G et al: "Proposal of interband Tunneling Structures with Strained Layers" Journal of Applied Physics, US, American Institute of Physics. New York, vol. 76, No. 6. Sep. 15, 1994 pp. 3620–3622 XP000470074 ISSN: 0021–8979.

Beresford R et al: "Interband Tunneling in Single–Barrier INAS/AISB/GASB Heterostructures" Applied Physics Letters, US, American Institute of Physics. New York, Vol 56, No. 10. Mar. 5, 1990, pp. 952–954 XP000133498 ISSN: 0003–6951.

Chang, C A et al: "InAs–AlSb–GaSb Tunnel Diode (MBE Growth)" IBM Technical Disclosure Bulletin, Aug. 1982, USA, vol. 25, No. 3A, pp. 1185–1186 XP002162840 ISSN: 0018–8689.

Tehrani S et al: "Three Terminal Quantum Structure Based on Resonant Interband Tunneling" Proceedings of the IEEE/Cornell Conference on Advanced Concepts in High Speed Semiconductor Devices and Circuits, US, New York, IEEE Aug. 7, 1995, pp. 460–464 XP000626632 ISBN: 0–7803–2443–9.

Kitabayshi H et al: "Crucial Role of Extremely Thin AiSb Barrier Layer in INAS/ALSB/INAS Resonant Interband Tunneling Diodes" Extended Abstracts of the International Conference on Solid State Devices and Materials, Japan Society of Applied Physics. Tokyko, JA, Sep. 1, 1997, pp. 412–413 XP000728173.

Schulman J N et al: "INAS/Antimonide–Based Resonant Tunneling Structures with Ternary Alloy Layers" Solid State Electronics, GB, Elsevier Science Publishers, Barking, vol. 37, No. 4/06 Apr. 1, 1994 pp. 981–985, XP000442959 ISSN:0038–1101.

Takaoka, H et al: "GaSb–AlSb–InAs Multi–Heterojunctions", Physica, North–Holland Publishing Co Yorktown Heights, NY vol. 117(B) & 118(B) 1983 pp. 741–743.

Luo, L F et al: "Interband Tunneling in Polytype GaSb/AlSb/InAs Heterostructures" Applied Physics Letters, American Institute of Physics vol. 55, No. 19, Nov. 6, 1989 pp. 2023–2025.

* cited by examiner

TYPE II INTERBAND HETEROSTRUCTURE BACKWARD DIODES

TECHNICAL FIELD

This invention relates in general to semiconductor devices, and in particular to backward diodes useful in radio frequency detection and mixing.

BACKGROUND OF THE INVENTION

The tunnel diode is a well-known semiconductor device that conventionally includes two regions of heavily doped semiconductor material of opposite conductivity types, separated by a relatively thin junction which permits charge carriers to tunnel through upon the application of a suitable operating potential to the semiconductor regions. The p and n regions of tunnel diodes are so heavily doped that they are degenerate. At equilibrium, a portion of the valence band in the p region of the diode is empty and a portion of the conduction band in the n region is filled.

A slight forward bias brings some levels of the filled portion of the conduction band of the n region into energetic alignment with empty levels of the valence band of the p region. In this situation, quantum-mechanical tunneling allows electrons to flow from the n region to the p region, giving a positive current that first increases with increasing bias. When the filled part of the conduction band of the n region is maximally aligned with the empty part of the valence band of the p region, the current flow is maximized. Subsequently, the current decreases with increasing forward bias, and approaches a minimum value when the filled part of the conduction band of the n region lies opposite the energy gap of the p region. When a yet larger forward bias occurs, electrons and holes are injected over the barrier between the p and n regions, resulting in a rapid increase in current for increasing forward bias. Thus, the current-voltage has a negative differential conductance part in the forward region of the characteristic.

Use of a heterostructure consisting of adjoining regions of $GaSb_{1-y}As_y$ and $In_{1-x}Ga_xAs$ interfaced with a tunneling junction is described in U.S. Pat. No. 4,198,644 entitled, "Tunnel Diode" issued to Leo Esaki on Apr. 15, 1980. The heterostructure presented in the Esaki patent discloses first and second layers of Group III–V compound semiconductor alloys wherein the first layer is an alloy including a first Group III material and a first Group V material, and the second layer is an alloy including a second Group III material different from the first Group III material and a second Group V material different from the first Group V material, and wherein the valence band of the first alloy is closer to the conduction band of the second alloy than it is to the valence band of the second alloy. The preferred embodiment identified In as the first Group III material, As as the first Group V material, Ga as the second Group III material, and Sb as the second Group V material.

Also, U.S. Pat. No. 4,371,884 entitled "InAs-GaSb Tunnel Diode", also issued to Leo Esaki provides for a tunnel diode requiring no heavy doping, and which the process of molecular beam epitaxy can readily fabricate. The '884 tunnel diode heterostructure comprises first and second accumulation regions of relatively lightly doped group III–V compounds specifically consisting of $In_{1-x}Ga_xAs$ and $GaSb_{1-y}As_y$, where concentrations expressed in terms of x and y are preferably zero but less than 0.3, and where the improvement consists of an interface of a relatively thin layer of a quaternary compound whose constituent materials are those of the adjoining regions. This interface provides a tunneling junction as opposed to an ohmic junction between contiguous regions of InAs and GaSb.

An object of the present invention is to provide a new and useful improvement in tunneling diodes in order to expand their application to higher bandwidths, with greater dynamic range and greater sensitivity for radio frequency detection. In particular, the present invention is designed to provide a high degree of non-linearity near zero bias. This is in contrast to patents discussed above, which are designed to provide a negative resistance region for non-zero bias.

The present invention uses AlSb and AlGaSb layers to control the curvature of the current voltage (I-V) curve and current density through the device, thus decreasing the forward current while allowing the tunneling current in the negative bias direction to be relatively large and unaffected. The desirable characteristic of this design is to provide a highly nonlinear portion of the I-V curve near zero bias, which is greatly improved by the presence of the AlGaSb layers.

SUMMARY OF THE PRESENT INVENTION

According to the invention there is provided a high-speed semiconductor device that exhibits an interband tunneling characteristic. The present invention comprises two semiconductor regions having mutually different compositions from one another and separated by a thin interface layer through which tunneling occurs.

The semiconductor regions exhibit gaps that are shifted in mutually opposite directions and the interface layer is amply thin to allow for electron transfer via tunneling.

DETAILED DESCRIPTION

The present invention provides improved backward diode structures, which may be tailored to a variety of applications. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Figure 1:
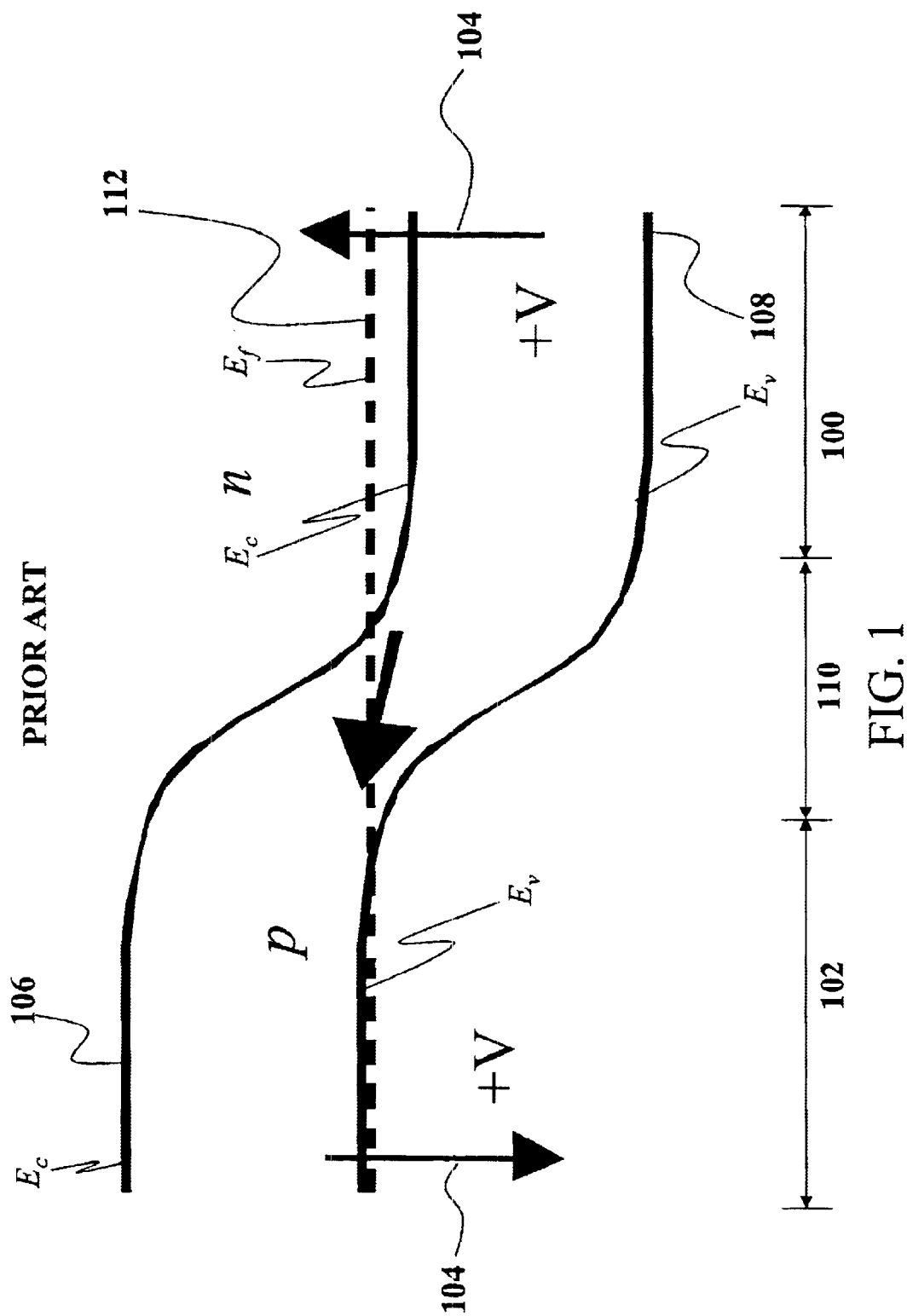
FIG. 1 is an band-edge diagram illustrative of a conventional implementation of a backward or Esaki diode.
Figure 2:
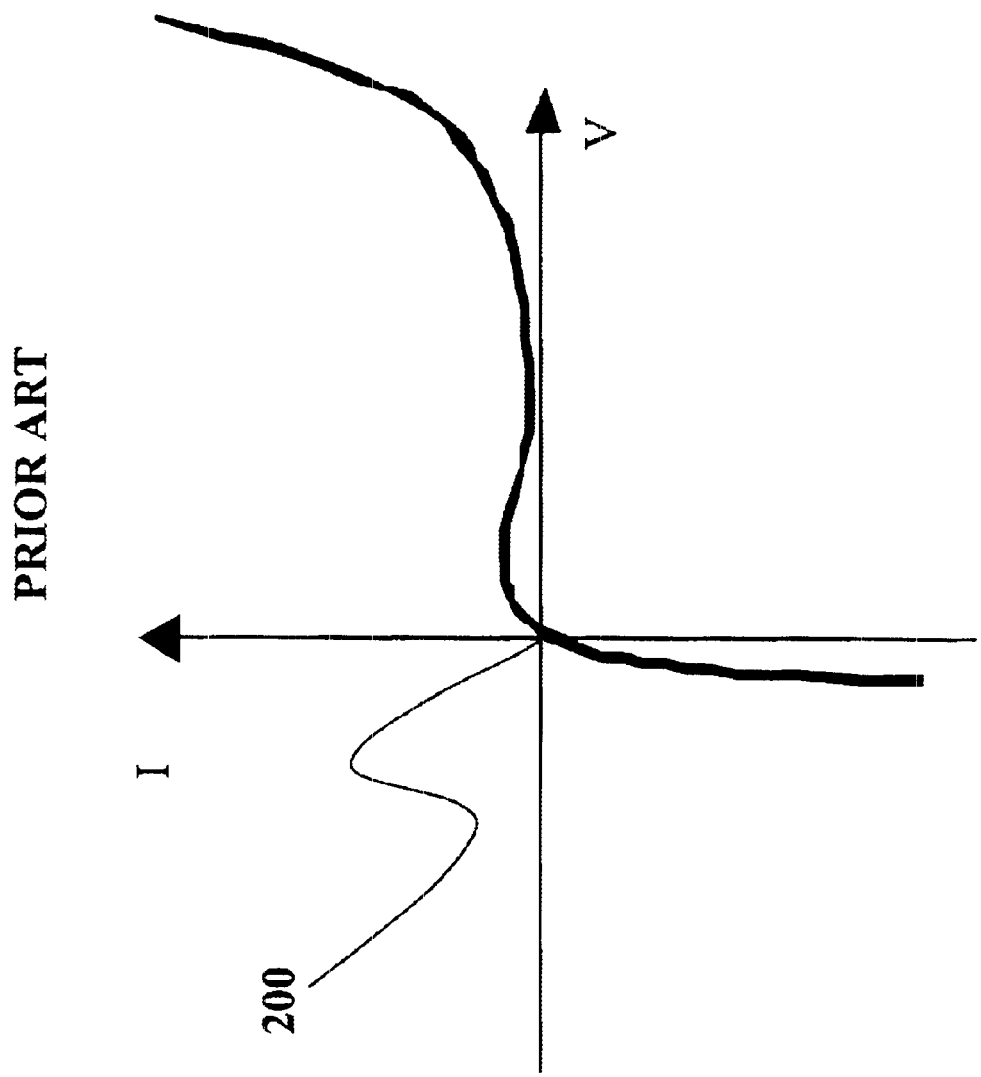
FIG. 2 is a qualitative example of the current-voltage characteristic diagram typically exhibited by the backward diode version of the Esaki diode.

FIG. 1 presents a band-edge diagram associated with the conventional heavily doped p-n junction in Ge or another semiconductor. The heavy doping causes the energy bands to bend such that electrons in the n-type side can tunnel through the relatively thin band-bending region into the p-type side. If the doping is very heavy on both sides, a negative differential resistance peak in the current-voltage (I-V) curve is produced for positive bias as electrons tunnel from the n-side 100 to the holes in the p-side 102. Both the n-type and p-type layers are typically formed of Ge. The arrows on the left and right sides of the FIG. 104 indicate the direction of the shift of the conduction band edge 106 and the valence band edge 108 with positive bias. For sufficient positive bias, the electron energies are too high for tunneling into the hole states, and negative differential resistance results. For negative bias, if the doping is high, the band-bending region 110 is short, and the electrons from the p-side 102 at energies below the Fermi level 112 can tunnel (from left to right) into the n-side 100 above the Fermi level 112. The resulting current can be large, and increases exponentially with reverse bias. If the doping of the p-side 102 doping is not too large, the Fermi level 112 will be close to the valence band edge 108 on the p-type side 102. In this state, there will not be many hole states for the electrons to tunnel into with forward bias. The peak current of the negative resistance current-voltage curve will be small, while the tunneling current in the negative bias direction is relatively unaffected and large, as shown in FIG. 2. This is the backward diode version of the Esaki diode. The desirable characteristic is the highly nonlinear current-voltage curve characteristic near zero bias 200, which makes it useful for mixing and detecting radio frequency signals.

Figure 3:
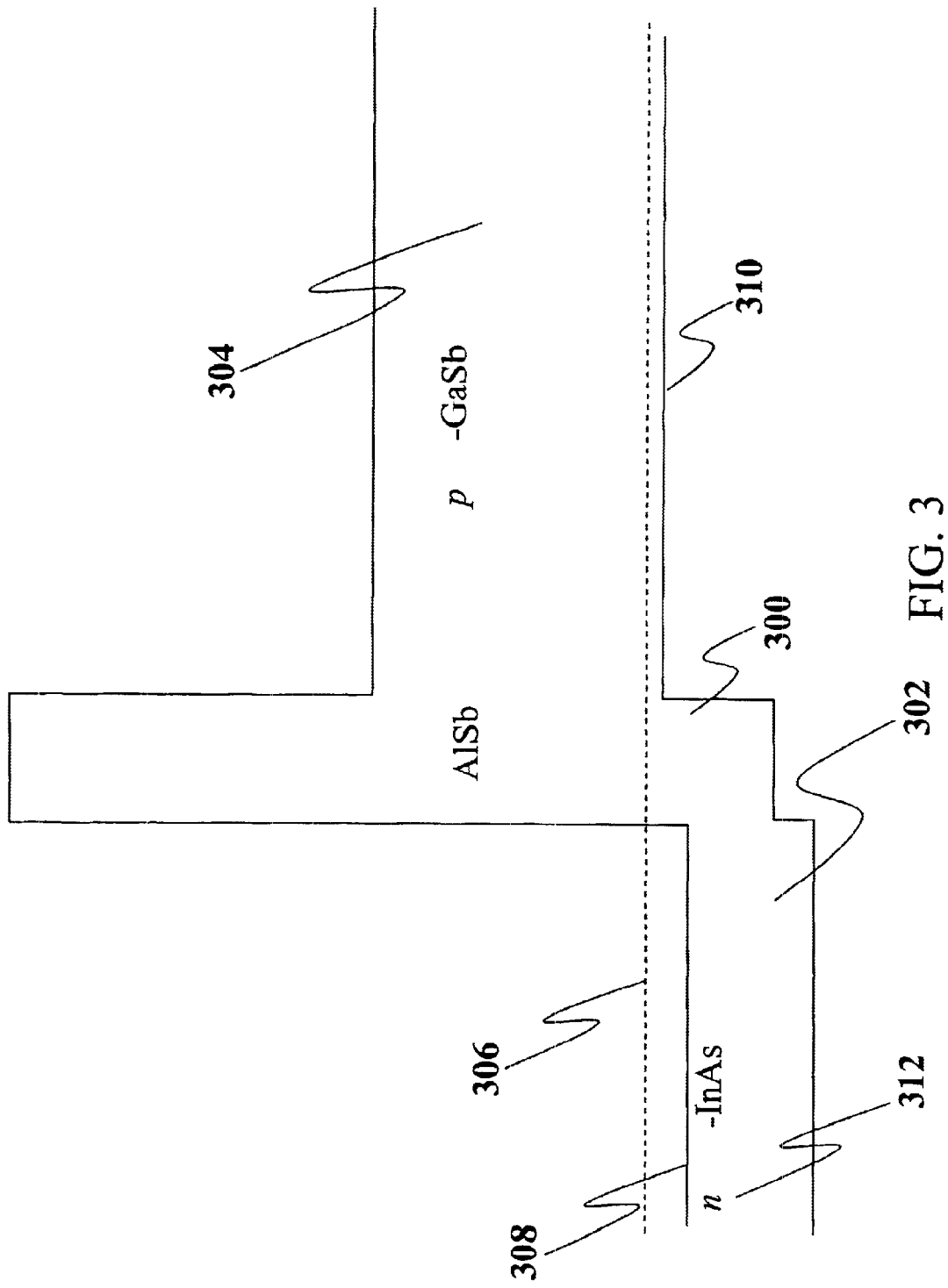
FIG. 3 is a band-edge diagram illustrative of the InAs/AlSb/GaSb heterostructure backward diode system of an embodiment of the present invention.

The present invention achieves improved behavior using an InAs/AlSb/GaSb heterostructure system, an example band-edge diagram for which is depicted in FIG. 3. This structure exhibits very little non-linearity at zero bias. The presence of an AlSb layer 300 provides greater design flexibility than the exclusive use of InAs and GaSb layers (302 and 304, respectively). The width of the AlSb layer 300 can be designed to provide tailorable tunneling between the InAs layer 302 and the GaSb layer 304. This is in contrast with the InAs/GaSb heterolayer system, which has a unique tunneling condition. For purposes of illustration simplicity, no band-bending is demonstrated such as that shown in FIG. 1, although it will generally be present in actual application. The Fermi level 306 is above the edge of the GaSb valence band edge 310 in the p-type GaSb layer 304. The electron transport for forward bias (left to right in the figure) will be desirably small due to the lack of holes in the p-doped GaSb side 304 to tunnel into. However, the electron transport for backward bias (right to left in the figure) will also be small for small bias, because of the small density of holes in the GaSb side for carrying the current.

If the Fermi level is between the conduction band edge 308 of the InAs layer 312 and the GaSb valence band edge 310, the forward and backward currents are approximately proportional to the bias voltage over a range, and thus the non-linearity is small.

Figure 4:
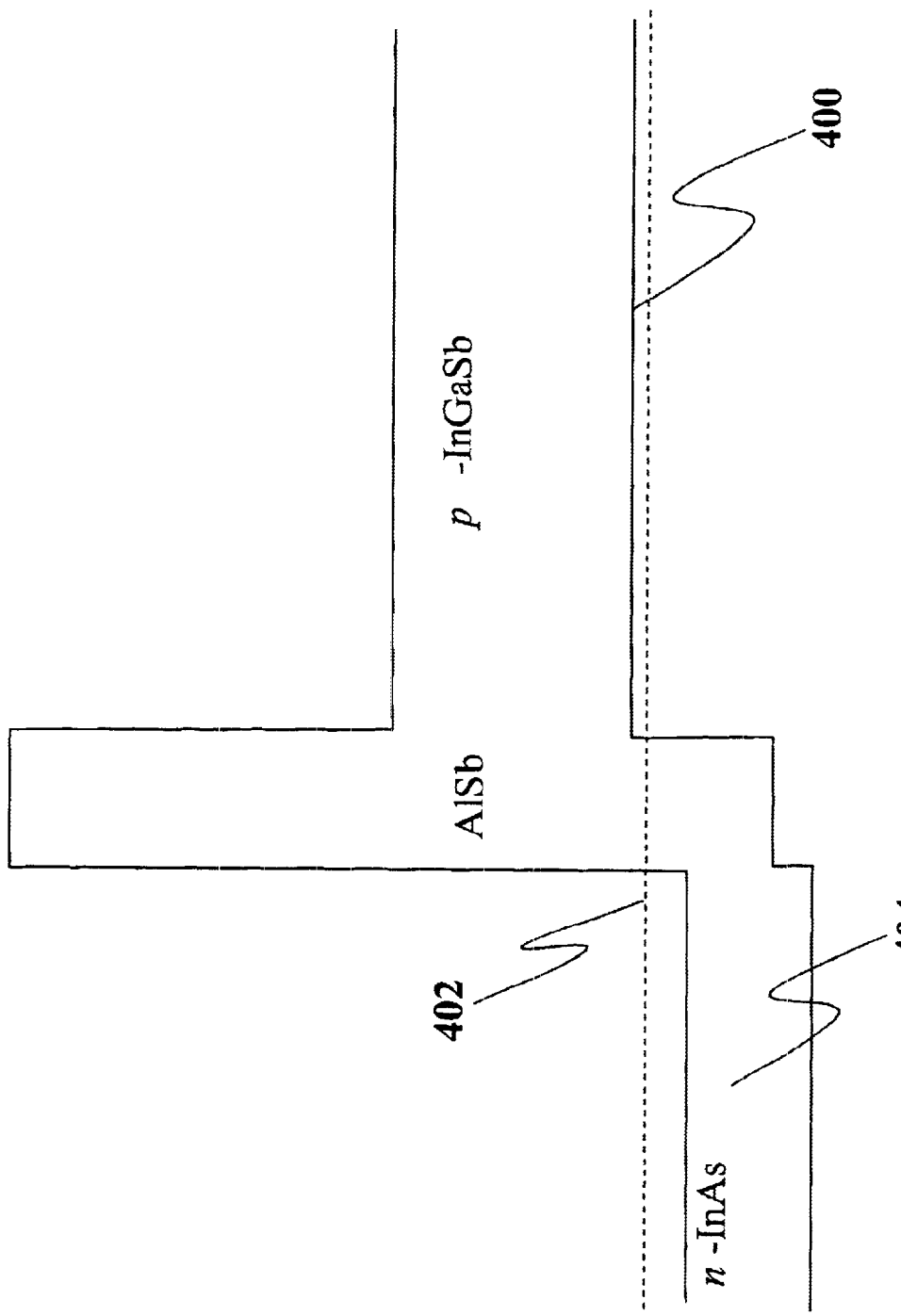
FIG. 4 is a band-edge diagram illustrative of a variation of the embodiment of the present invention shown in FIG. 3, wherein InGaSb is substituted for GaSb.

A band-edge diagram of a variation of the embodiment of FIG. 3 is shown in FIG. 4, where InGaSb is substituted for GaSb. The edge of the InGaSb valence band 400 is raised by a small amount relative to that of the edge of the GaSb valence band 310 shown in FIG. 3, allowing electrons at the top of the InGaSb valence band 400 access to the energy range above the Fermi level 402 in the InAs layer 404 when negatively biased. The Fermi level 402 in the InGaSb layer 400 is preferably tailored close to the InGaSb valence band edge 400 to minimize forward current. Still, the density of holes in the InGaSb side may be too small to allow for sufficient backward current.

Figure 5:
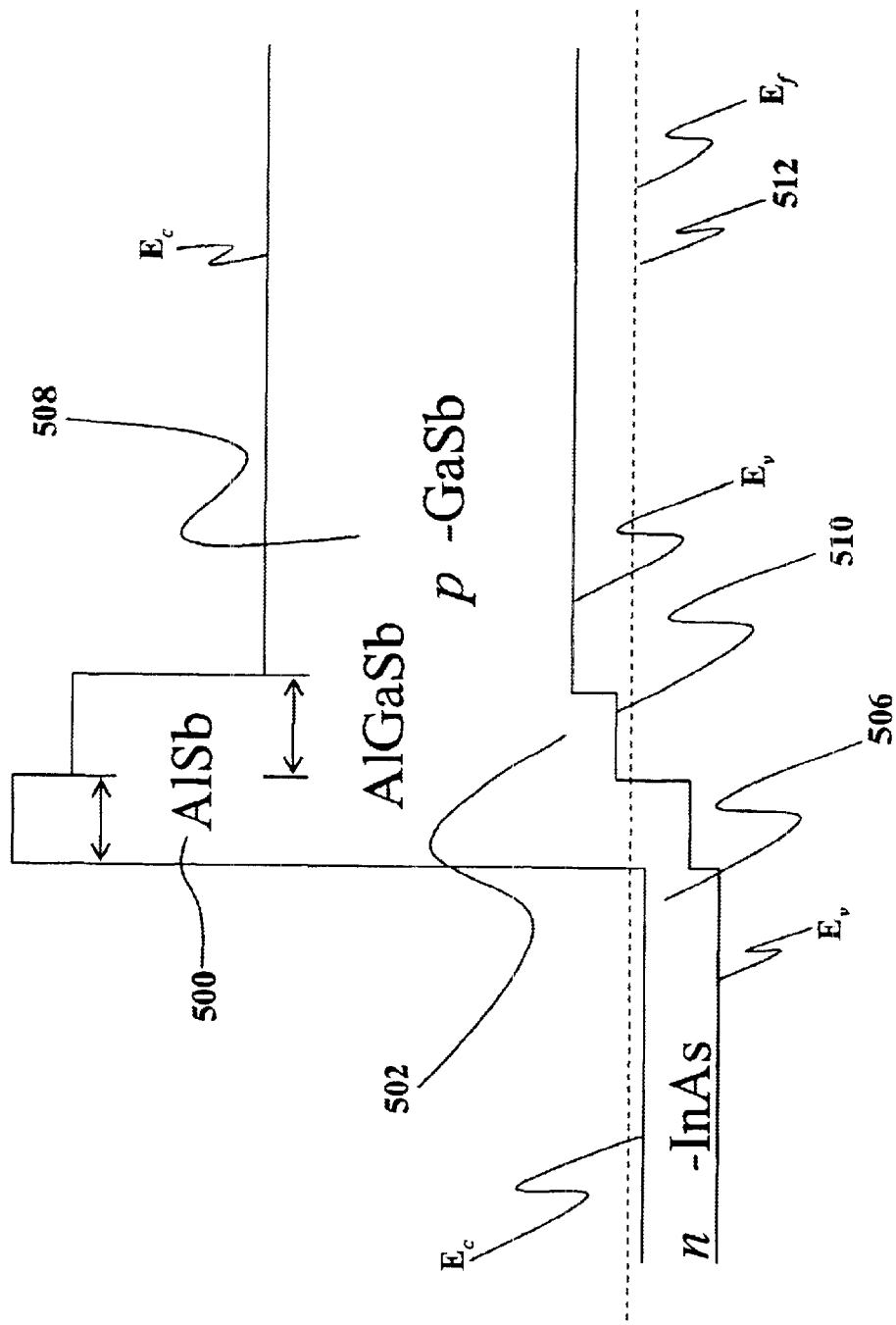
FIG. 5 is a band-edge diagram illustrative of another variation of the embodiment of the present invention shown in FIG. 3, wherein two types of barriers are present, namely AlSb and AlGaSb.
Figure 6:
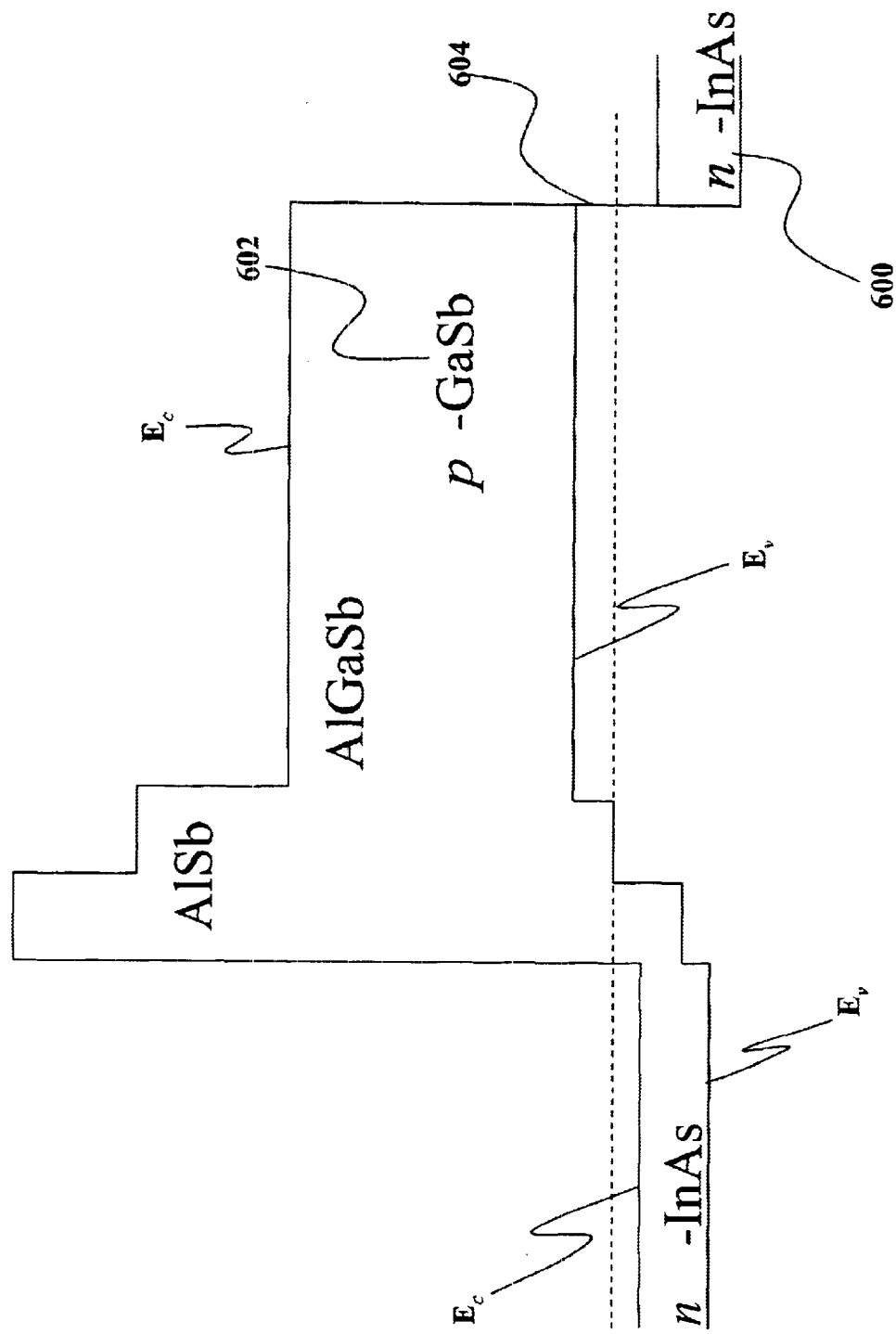
FIG. 6 is a band-edge diagram of an embodiment of the present invention similar to that shown in FIG. 5, with an additional n-type InAs layer formed on the p-type GaSb layer on the right-hand side of the FIG. 5.

In FIG. 5 and FIG. 6 two further modifications are depicted. Two types of barriers, AlSb 500 and AlGaSb 502, are depicted in FIG. 5. The addition of Ga to provide AlGaSb decreases the barrier band gap and the valence band discontinuity with GaSb. The thickness of the AlSb barrier 500 is adjustable to control the overall current due to tunneling, while the AlGaSb barrier 502 contributes additional blocking to the forward current, i.e. electrons tunneling from the InAs layer 506 through to the GaSb layer 508. However, the AlGaSb barrier does not significantly block the (beneficial) backward tunneling of electrons from the AlGaSb barrier valence band 510 as they are "underneath" the AlGaSb barrier 502 and can flow into available states above the Fermi level 512 in the InAs region 506. As the Fermi level can now be significantly below the GaSb valence band edge, there will be sufficient holes to carry the backward current. In FIG. 6 there is shown an additional n-type InAs cladding layer 600 on the p-type GaSb layer 602 on the right. There is no barrier at the right side interface 604, thus providing a convenient transition back to an InAs n-type contact on the right.

Figure 7:
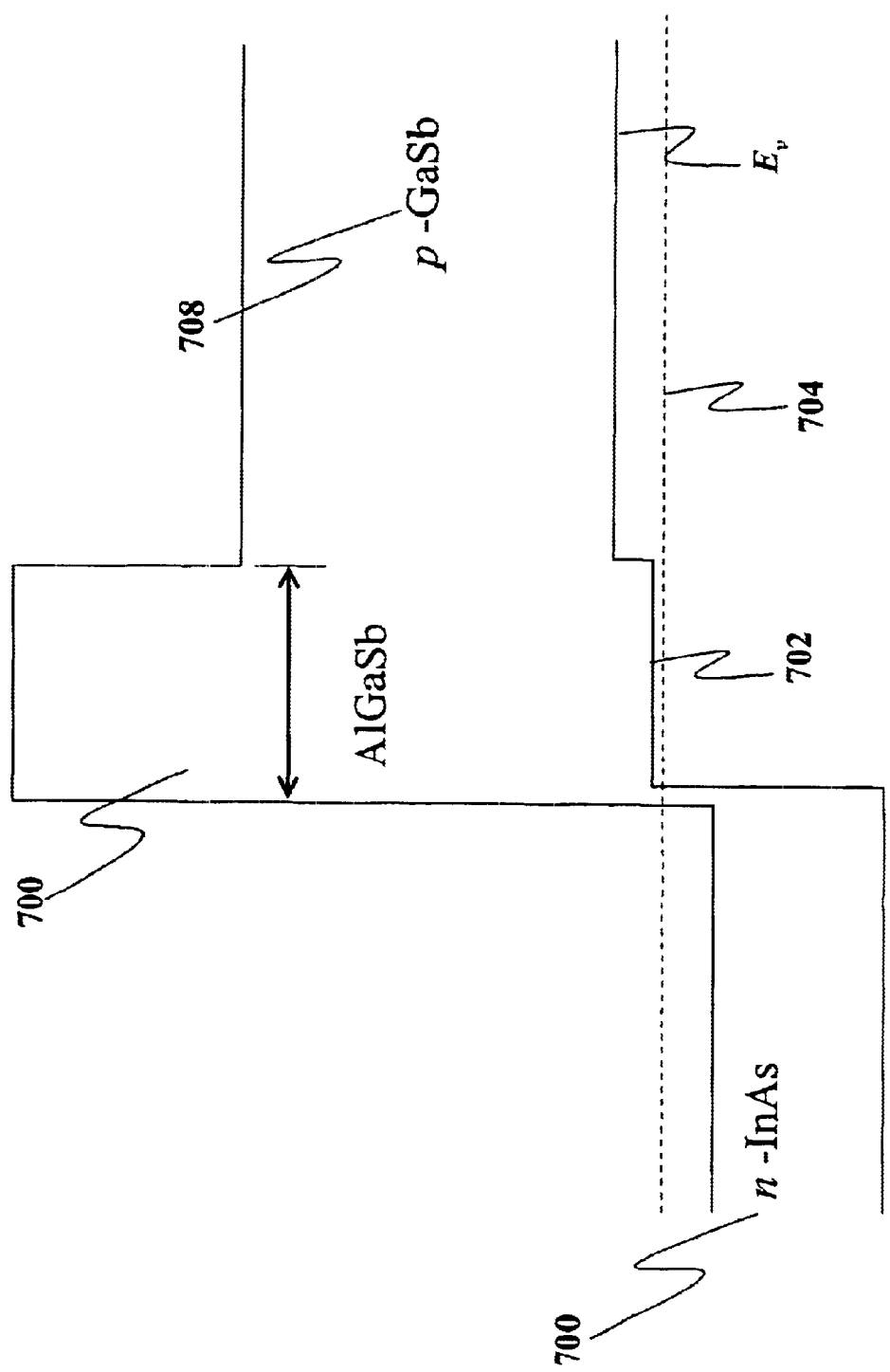
FIG. 7 is a band-edge diagram illustrative of another variation of the embodiment of the present invention shown in FIG. 3, wherein a single AlGaSb barrier with an adjustable valence band is present.
Figure 8:
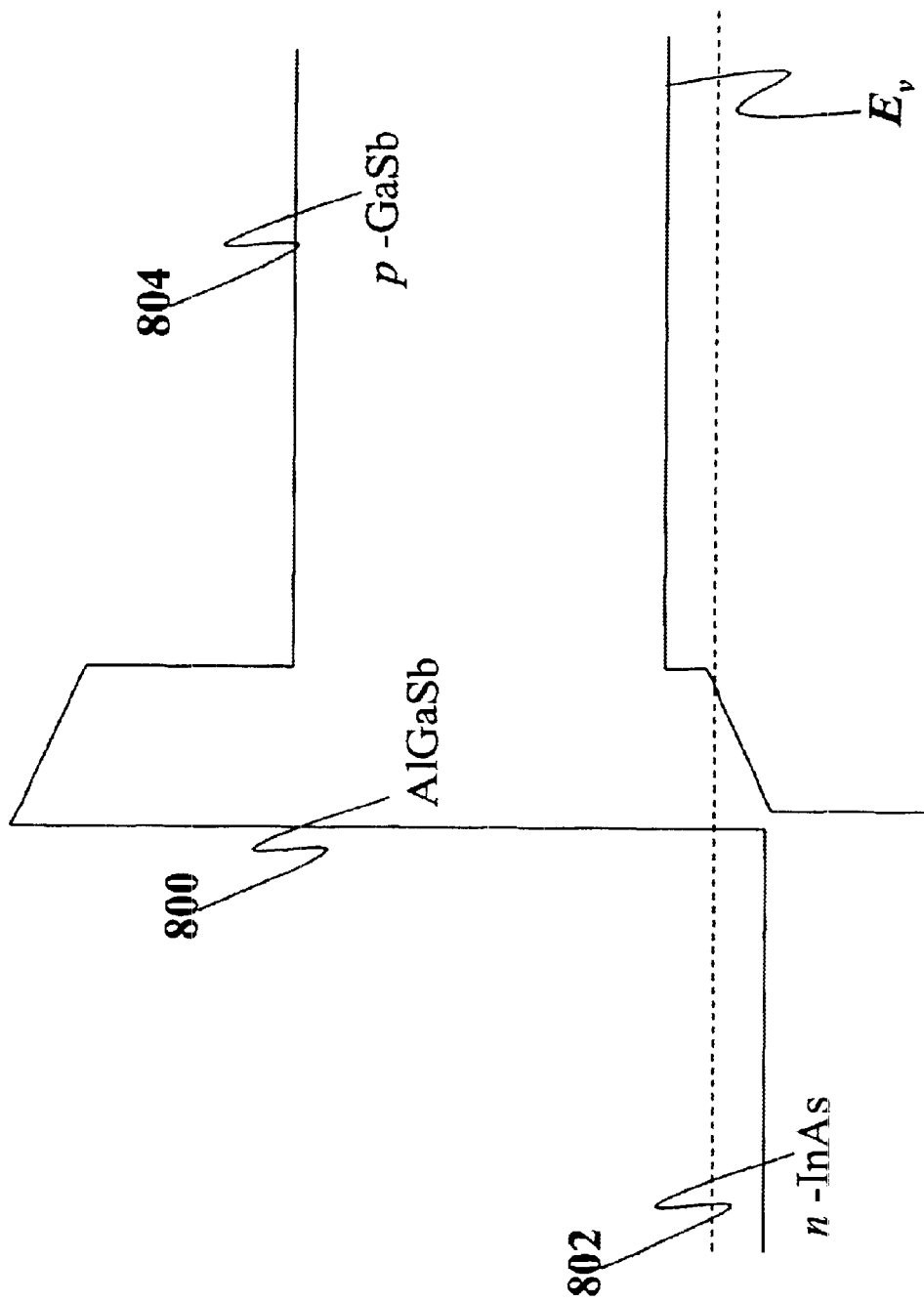
FIG. 8 is a band-edge diagram illustrative of another variation of the embodiment of the present invention shown in FIG. 5, depicting the use of a continuously graded the barrier.

FIGS. 7 and 8 depict two additional embodiments. FIG. 7 demonstrates a single AlGaSb barrier 700 with an adjustable valence band edge 702. The valence band edge of the AlGaSb barrier 702 is close to the Fermi level 704. The presence of this barrier blocks electrons from the InAs layer 706 from tunneling through the large valence band barrier and reaching the GaSb layer 708 with forward bias. This variation can trade off higher currents for possibly lower nonlinearity since it lacks the AlSb barrier present in the embodiments shown in FIGS. 5 and 6. FIG. 8 depicts an embodiment of the present invention with a continuously graded AlGaSb barrier layer 800, combining a higher Al concentration in the AlGaSb layer 800 near the interface with the InAs layer 802 and a lower Al concentration in the AlGaSb layer 800 near the interface with the GaSb layer 804. This condition will produce an enhanced nonlinear increase in the backward current with negative bias, as the width of the effective triangular barrier that the valence band electrons must tunnel through decreases with bias.

What is claimed is:

1. A semiconductor device exhibiting an interband tunneling characteristic, including a first semiconductor region and a second semiconductor region, each having a mutually different composition and conductivity type, and separated by an interface layer, the first semiconductor region having a first energy band gap and the second semiconductor region having a second energy band gap, wherein the first and second semiconductor regions are selected such that the first energy band gap and the second energy band gap are shifted in mutually opposite directions, and wherein the interface layer is sufficiently thin to allow for electron carrier transfer between the first semiconductor region and the second semiconductor region to occur via tunneling through the interface layer; and further wherein the first semiconductor region is below the Fermi level and the second semiconductor region is above the Fermi level, and wherein the first semiconductor region, the second semiconductor region, and the interface layer are further comprised of conduction band edges and valence band edges, and wherein the conduction band edge of one of the first semiconductor region lies below the valence band edge of the other of the second semiconductor region, and wherein, the valence band edge of the interface layer overlaps with the first energy band gap of the first semiconductor region.

2. A semiconductor device exhibiting an interband tunneling characteristic, including a first semiconductor region and a second semiconductor region, each having a mutually different composition and conductivity type, and separated by an interface layer, the first semiconductor region having a first energy band gap and the second semiconductor region having a second energy band gap, wherein the first and second semiconductor regions are selected such that the first energy band gap and the second energy band gap are shifted in mutually opposite directions, and wherein the interface layer is sufficiently thin to allow for electron carrier transfer between the first semiconductor region and the second semiconductor region to occur via tunneling through the interface layer; and further wherein the first semiconductor region is comprised of InAs and the second semiconductor region is comprised of $In_{1-x}Ga_xSb$ where $1 \geq x \geq 0$ and the interface layer is comprised of AlSb.

3. A semiconductor device exhibiting an interband tunneling characteristic, including a first semiconductor region and a second semiconductor region, each having a mutually different composition and conductivity type, and separated by an interface layer, the first semiconductor region having a first energy band gap and the second semiconductor region having a second energy band gap, wherein the first and second semiconductor regions are selected such that the first energy band gap and the second energy band gap are shifted in mutually opposite directions, and wherein the interface layer is sufficiently thin to allow for electron carrier transfer between the first semiconductor region and the second semiconductor region to occur via tunneling through the interface layer; and further wherein the first semiconductor region is comprised of InAs, and the second semiconductor region is comprised of $In_{1-x}Ga_xSb$, where the value of x less than 0.3.

4. A semiconductor device as set forth in claim 1, wherein one of the first and the second semiconductor regions is comprised of n-type semiconductor material and the other of the first and the second semiconductor regions is comprised of p-type semiconductor material.

5. A semiconductor device as set forth in claim 1, wherein one of the first and the second semiconductor regions is comprised of n-type InAs, and other of the first and the second semiconductor regions is comprised of p-type InGaSb, and the interface is comprised of AlSb.

6. A semiconductor device as set forth in claim 2, wherein the concentration of the interface layer constituent materials forms a graded interface transition band region between the respective conduction band edges and the respective valence band edges of the first and the second semiconductor regions, and wherein the conduction band edge of one of the semiconductor regions at the interface layer lies below the valence band edge of the other of the semiconductor regions at the interface layer.

7. A semiconductor device as set forth in claim 2, wherein either the first or the second semiconductor region is comprised of n-type InAs, and the other of the first or the second semiconductor regions is comprised of p-type InGaSb.

8. A semiconductor device as set forth in claim 2, wherein the interface layer is comprised of a compound of at least two materials selected from the group consisting of Al, Sb, and Ga.

9. A semiconductor device as set forth in claim 2, wherein the first semiconductor region is comprised of InAs, and the second semiconductor region is comprised of a compound selected from the group consisting of InGaSb and GaSb, and wherein the interface layer is selected from the group consisting of AlSb and AlGaSb.

10. A semiconductor device as set forth in claim 3, wherein the concentration of the interface layer constituent materials forms a graded interface transition band region between the respective conduction band edges and the respective valence band edges of the first and the second semiconductor regions, and wherein the conduction band edge of one of the semiconductor regions at the interface layer lies below the valence band edge of the other of the semiconductor regions at the interface layer.

11. A semiconductor device as set forth in claim 3, wherein either the first or the second semiconductor region is comprised of n-type InAs, and the other or the first or the second semiconductor regions is comprised of p-type InGaSb.

12. A semiconductor device as set forth in claim 3, wherein the first semiconductor region is comprised of InAs, and the second semiconductor region is comprised of a compound selected from the group consisting of InGaSb and GaSb, and wherein the interface layer is selected from the group consisting of AlSb and AlGaSb.

13. A semiconductor device as set forth in claim 3, wherein the interface layer is comprised of a compound of at least two materials selected from the group consisting of Al, Sb, and Ga.

14. A semiconductor device as set forth by claim 13, wherein the interface layer is interface layer is comprised of a compound including Al and at least one material selected from the group consisting of Sb and Ga.

15. A semiconductor device as set forth in claim 14, wherein a combination of Al and Ga occupy fifty percent of the AlGaSb lattice sites and Sb occupies the remaining sites.

16. A semiconductor device as set forth in claim 14, wherein the concentration of the interface layer constituent materials forms a continuously graded interface transition band region between the respective conduction band edges and the respective valence band edges of the first and the second semiconductor regions, and wherein the conduction band edge of one of the semiconductor regions at the interface layer lies below the valence band edge of the other of the semiconductor regions at the interface layer.

17. A semiconductor device as set forth in claim 16, wherein either the first or the second semiconductor region is comprised of n-type InAs, and the other of the first or the second semiconductor regions is comprised of p-type InGaSb.

* * * * *